(12) United States Patent
Sukekawa et al.

(10) Patent No.: US 8,807,416 B2
(45) Date of Patent: Aug. 19, 2014

(54) REFLOW SOLDERING SYSTEM

(71) Applicant: Denso Corporation, Kariya (JP)

(72) Inventors: Takuji Sukekawa, Obu (JP); Hiroyuki Yamada, Obu (JP); Noriyasu Inomata, Toyota (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/668,988

(22) Filed: Nov. 5, 2012

(65) Prior Publication Data
US 2013/0119112 A1 May 16, 2013

(30) Foreign Application Priority Data

Nov. 15, 2011 (JP) ................... 2011-249477

(51) Int. Cl.
*B23K 37/00* (2006.01)
*B23K 37/04* (2006.01)
*B23K 31/02* (2006.01)
*B23K 3/08* (2006.01)
*B23K 3/00* (2006.01)
*B23K 3/04* (2006.01)
*H05K 3/34* (2006.01)

(52) U.S. Cl.
CPC ............... *B23K 3/00* (2013.01); *H05K 3/3494* (2013.01); *B23K 3/08* (2013.01); *B23K 3/04* (2013.01)
USPC ............... 228/9; 228/8; 228/178; 228/179.1; 228/180.1; 228/180.21; 228/180.22; 228/245; 228/44.3

(58) Field of Classification Search
CPC .............. B23K 3/00; B23K 3/08; B23K 3/04; H05K 3/3494
USPC ............ 228/178–180.22, 245–255, 8, 9, 44.3
See application file for complete search history.

(56) References Cited

U.S. PATENT DOCUMENTS

2003/0075939 A1* 4/2003 Bendat et al. ................. 294/64.1
2010/0012709 A1* 1/2010 Nikaido et al. ............... 228/256

FOREIGN PATENT DOCUMENTS

JP      A-2004-304098      10/2004
JP      A-2010-219158       9/2010

* cited by examiner

*Primary Examiner* — Erin Saad
(74) *Attorney, Agent, or Firm* — Oliff PLC (57) ABSTRACT

A reflow soldering system wherein a heating oven is provided with a contact heating unit which has a transport rail and a top heat transfer heater, and with a hot gas blowing heating unit, the transport rail and top heat transfer heater are respectively provided with heaters which heat the outer edge part of the printed circuit board, and the transport rail or top heat transfer heater moves in an up-down direction so that the transport rail and top heat transfer heater clamp and heat the outer edge part of the printed circuit board.

5 Claims, 13 Drawing Sheets

PRIOR ART

REFLOW SOLDERING SYSTEM

BACKGROUND OF THE INVENTION

1. Field of the Invention

The present invention relates to a reflow soldering system which solders a printed circuit board (PCB) wherein the system features both the high heat transfer rate of heating by contact heat transfer and the uniform heating of heating by blowing hot gas.

2. Description of the Related Art

In the conventional reflow soldering method of printed circuit boards, as shown in Japanese Unexamined Patent Publication No. 2004-304098, in particular FIG. 5, the practice has been to hold a printed circuit board for heating in a preheating zone of a reflow oven at a 100 to 200° C. preheating temperature, then rapidly raise the temperature to the peak temperature. If soldering a printed circuit board by the conventional reflow soldering method, there were the problems that microballs were formed around the soldered part or the electronic devices deviated in position from the soldered parts.

In particular, to handle large numbers of types of products, it is necessary to increase the oven length for thermal soaking. The heating time was forced to become longer and the facilities to become larger in size.

SUMMARY OF THE INVENTION

The present invention, in view of the above problem, provides a reflowing soldering system which solders a printed circuit board and has both the high heat transfer rate of heating by contact heat transfer and the uniform heating of heating by blowing hot gas.

To solve the above problem, the aspect of the invention of claim 1 provides a reflow soldering system which transports a printed circuit board on which a solder paste has been printed or coated to a sealable heating oven for reflow soldering, wherein the heating oven is provided with a contact heating unit which has a transport rail which supports an outer edge part of the printed circuit board from the bottom and a top heat transfer heater which supports an outer edge part of the printed circuit board from above, and with a hot gas blowing heating unit, the transport rail and top heat transfer heater are respectively provided with heaters which heat the outer edge part of the printed circuit board, and the transport rail or top heat transfer heater moves in an up-down direction after loading of the printed circuit board so that the transport rail and top heat transfer heater clamp and heat the outer edge part of the printed circuit board.

The inventors took note of the high heat transfer rate by heating by contact heat transfer and the uniform heating and fast speed of heating by blowing hot gas and made joint use of heating by contact heat transfer and heating by blowing hot gas to thereby enable realization of small sized, high speed uniform heating. The outer edge part of the printed circuit board P is clamped from the top and bottom directions (i.e., the warping direction of the board) and heated by contact heat transfer, so warping of the board can be suppressed. For this reason, soldering is never performed in a state with the board warped due to the difference in heat expansion of the resin and the copper interconnects which form the board.

The aspect of the invention of claim 2 comprises the aspect of the invention of claim 1 wherein the inside of the printed circuit board surrounded by the outer edge part is heated by the hot gas blowing heating unit while controlling the air flow and hot air temperature. Due to this, while heat is transferred from the outer edge sides, at the center part of the printed circuit board, the printed circuit board is supplied with hot air by the hot gas blowing heating unit, so the printed circuit board is uniformly heated.

The aspect of the invention of claim 3 comprises the aspect of the invention of claim 1 wherein the transport rail is made to be able to handle different sizes of the outer edge part of the printed circuit board by being comprised of vertical and horizontal fixed outer frames and vertical and horizontal moving frames, where the transport direction of the printed circuit board is defined as the horizontal direction, and a heater is embedded inside. Due to this, different sizes of the outer edge part of the printed circuit board can be handled.

The aspect of the invention of claim 4 comprises the aspect of the invention of claim 3 wherein the vertical and horizontal fixed frames are comprised of a horizontal direction fixed horizontal external frame rail and a vertical direction fixed vertical outer frame, and the vertical and horizontal moving frames are comprised of a first moving horizontal rail, second moving horizontal rail, intermediate vertical frames, and a positioning stopper and are designed to be able to move matching with the size of the outer edge part and number of obtained boards of the printed circuit board. Here, the "number of obtained boards" mean the later explained two boards, four boards, or other numbers of obtained boards of a predetermined area into which the printed circuit board is divided.

The aspect of the invention of claim 5 comprises the aspect of the invention of claim 4 wherein the intermediate vertical frames and the positioning stopper are comprised to be able to move up and down independently of each other.

The aspect of the invention of claim 6 comprises the aspect of the invention of claim 1 wherein the reflow soldering system is provided with a preheating chamber and a cooling chamber.

The aspect of the invention of claim 7 comprises the aspect of the invention of claim 1 which has a hot air circulation system which makes hot air which is supplied from the hot gas blowing heating unit circulate to a preheating chamber, then has a fume recovery box cool flux fumes which are produced at the heating oven to condense for recovery, then furthermore makes the hot air circulate to the cooling chamber and merge with hot air which is supplied from the hot gas blowing heating unit. Due to this, at the fume recovery box, the flux fumes which were produced at the heating oven are cooled and made to condense for recovery, so an improvement in fume recovery efficiency can be obtained by flow path circulation control.

Note that, the above reference notations are illustrations which show the correspondence with specific examples described in the embodiments explained next.

BRIEF DESCRIPTION OF THE DRAWINGS

These and other objects and features of the present invention will become clearer from the following description of the preferred embodiments given with reference to the attached drawings, wherein:

FIG. 3C is a cross-sectional view of an intermediate vertical frame.

DESCRIPTION OF THE PREFERRED EMBODIMENTS

Below, referring to the drawings, embodiments of the present invention will be explained. In the embodiments, parts of the same configuration are assigned the same reference notations and explanations are omitted.

Figure 1:
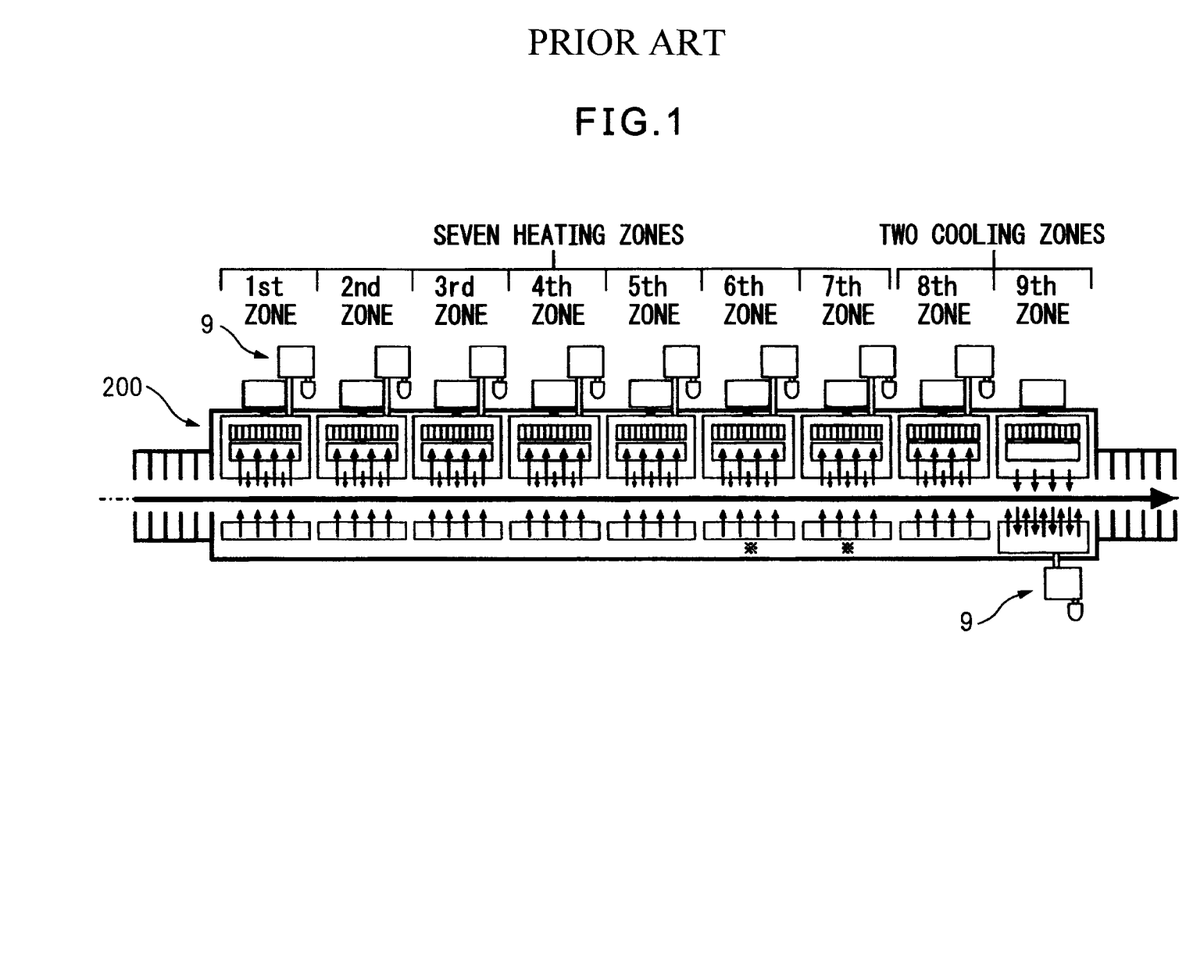
FIG. 1 is an explanatory view which explains comparative art which forms a basis of the present invention.

FIG. 1 is an explanatory view which explains a comparative art which forms a basis of the present invention. This comparative art is a hot air convection type reflow oven. This can handle a large number of types of products and enables uniform heating. However, in this comparative art, to enable uniform heating, the oven length has to be increased. The heating time ends up becoming longer and the facility ends up becoming larger in size. Further, in order to reduce the amount of use of nitrogen ($N_2$), the hot air circulation method is employed, but the facility is large in size and the entry and exit parts for the material being heated are opened for conveyor transport, so the flow of hot air cannot be controlled and flux fumes spread and stick to the inside of the oven. For this reason, the problem arose of requiring considerable time for cleaning. Furthermore, during reflow heating, printed circuit boards to be solded are only transported on a rail in a non-constrained state, so there was the problem that soldering was performed in the state with the board warped, due to the difference in heat expansion of the resin and copper interconnects in the boards and therefore this caused a bad effect on the soldering performance.

Figure 5:
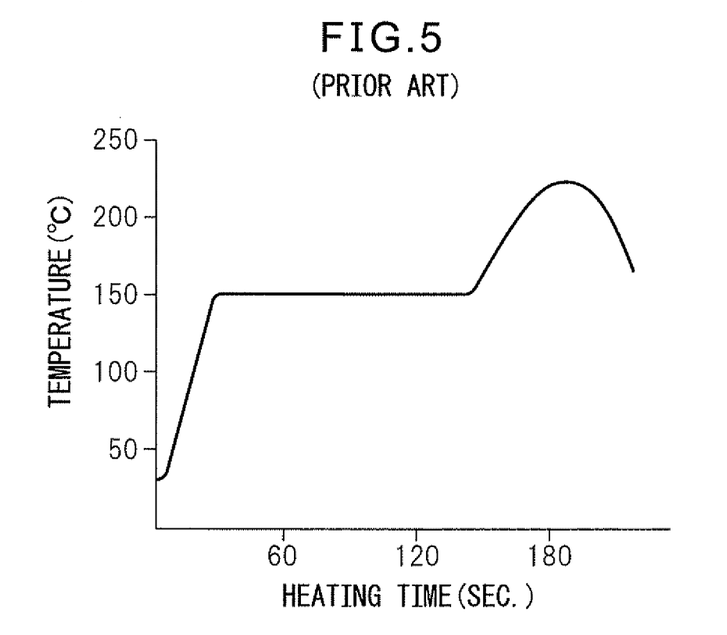
FIG. 5 is a thermal profile which is used for a reflow soldering method of the prior art.

In the comparative art of FIG. 1, the oven was divided into first to ninth zones, the first to seventh zones were heating zones, and the eighth and ninth zones were cooling zones. As one example, the oven extended to 5 to 6 meters. This comparative art is a continuous oven where the printed circuit boards to be soldered are continuously transported by a belt chain through the inside of a tunnel-shaped reflow oven. As seen in the thermal profile of FIG. 5, before making the temperature of a printed circuit board the melting point of usual solder or more, the temperature rise is halted and the temperature made to converge to a constant temperature (thermal soak) to ensure the uniform heating of the electronic devices which are carried on the printed circuit board. For this reason, the first to fifth zones are necessary.

For this comparative art, a small-sized reflow oven which uses both hot air and radiant heating has been proposed. However, with radiant heating, control of the difference in absorption of the radiant heat due to the color or material (glossiness etc.) of the material being heated is difficult, so it is not possible to realize reflow while maintaining uniform heating, no matter what the material to be heated is.

To solve such a problem, in the present embodiment, the inventors took note of the high heat transfer rate by heating by contact heat transfer, and the uniform heating and fast speed of heating by blowing hot gas, and made joint use of heating by contact heat transfer and heating by blowing hot gas to thereby enable realization of small-sized, high speed uniform heating. Further, there are also special features in the method of heating by contact heat transfer. A large number of types of products can be handled. In heating by contact heat transfer of the present embodiment, the outer edge part of the printed circuit board P is clamped from the top and bottom directions (that is, the warping direction of the board) and heated by contact heat transfer, so warping of the board can be suppressed. For this reason, soldering is never performed in a state with the board warped due to the difference in heat expansion of the resin and copper interconnects which form the board.

Figure 2:
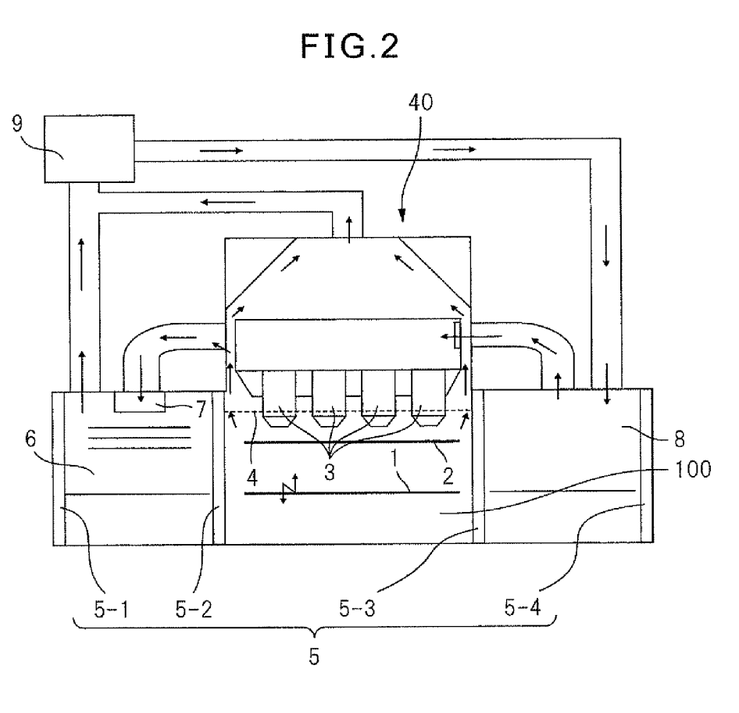
FIG. 2 is a schematic view which shows one embodiment of the present invention.

Below, one embodiment of the present invention will be explained in detail. FIG. 2 is a schematic view which shows one embodiment of the present invention. In FIG. 2, the transport rail 1 has a heat transfer heater (electric heater etc.) embedded in it. Functions as a transport rail and heat transfer heater are jointly used. The transport rail 1 moves up after a printed circuit board P (P', P") reaches a predetermined position and clamps and heats the board together with the top heat transfer heater 2. The hot gas blowing heating unit 3 supplies hot air to the printed circuit board P. In this case, the air flow and temperature which are calculated in advance from the temperature profile are respectively controlled for supply of the hot air. The amount of heat supplied is calculated from the results of analysis of heat transfer etc. based on the amount of shortage of heat which is obtained. A circulation path control plate 4 is a rectifying plate (punched metal etc.) for reutilization of hot air so as to reutilize the hot air which is supplied by the hot gas blowing heating unit 3. The heating oven 100 is comprised of a transport rail 1, top heat transfer heater 2, hot gas blowing heating unit 3 which supplies compressed nitrogen ($N_2$) etc., and circulation path control plate 4.

Doors 5 (5-1 to 5-4) open and close with a time lag so as to prevent the oxygen ($O_2$) concentration of the heating oven 100 from changing. In FIG. 2, the preheating chamber 6 is jointly used as a preheating chamber and a spare chamber for maintaining the oxygen concentration and enables preheating by utilizing hot air. The cooling chamber 8 is jointly used as a cooling chamber and a spare chamber for maintaining the oxygen concentration. When a printed circuit board P is loaded into the preheating chamber 6, the door 5-1 opens (moves up or down) and the door 5-2 of the heating oven 100 closes. Similarly, when the door 5-3 opens, the door 5-4 of the cooling chamber 8 closes. A motor fan 7 guides hot air into the preheating chamber 6. A fume recovery box 9 causes flux fumes which were produced in the heating oven 100 to cool and condense for recovery. A recirculation circuit of a hot air circulating system 40 has a not shown separate motor fan for pulling in hot air from the preheating chamber 6 or blowing cool air to the motor fan 7.

As shown in FIG. 2, the hot air circulating system 40 causes hot air which has been supplied from the hot gas blowing heating unit 3 to circulate in the preheating chamber 6. In the fume recovery box 9, flux fumes which are produced in the heating oven 100 are cooled to make them condense for recovery. After passing through the fume recovery box 9, then being further circulated to the cooling chamber 8, the circulated air are made to merge with the hot air which is supplied from the hot gas blowing heating unit 3. The recirculation circuit of the hot air circulating system 40 additionally can modified into various circuits, but has to be designed to pass through the recovery box 9. Due to this, an improvement in the fume recovery efficiency by flow path control is obtained.

Figure 3A:
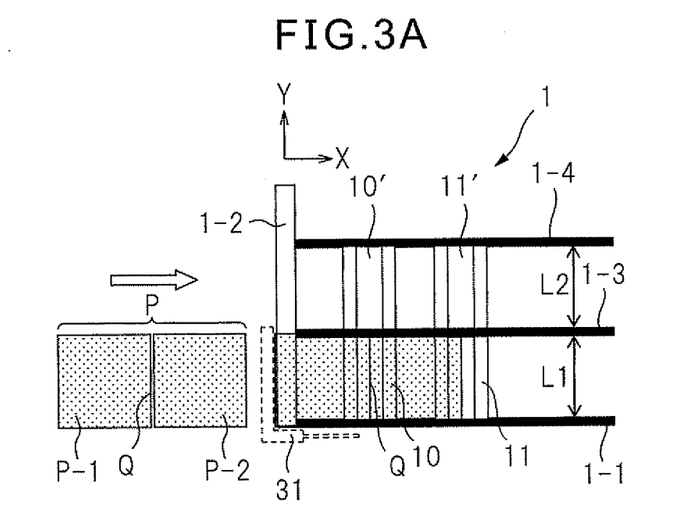
FIG. 3A is an explanatory view of a transport rail of one embodiment of the present invention in the case of two obtained boards.
Figure 3B:
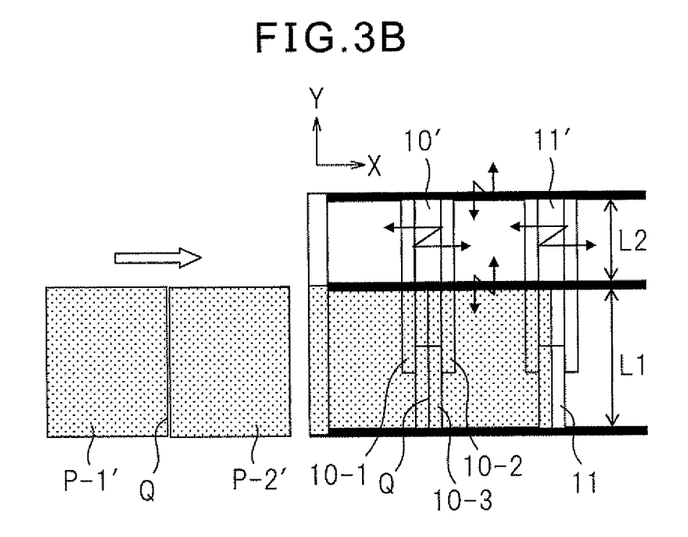
FIG. 3B is an explanatory view of a transport rail of one embodiment of the present invention in the case of changing the vertical direction (width direction, Y-axis direction) in the case of two obtained boards.
Figure 3C:
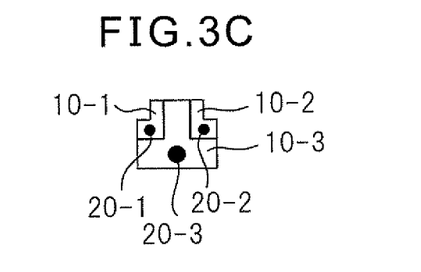
Figure 3D:
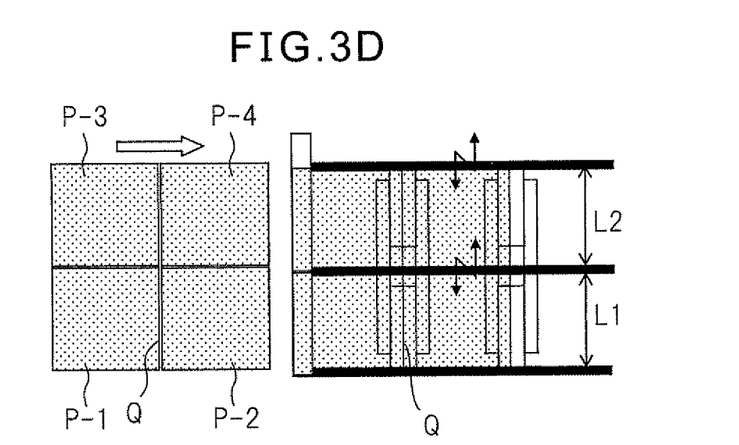
FIG. 3D is an explanatory view of a transport rail of one embodiment of the present invention in the case of four obtained boards.
Figure 4A:
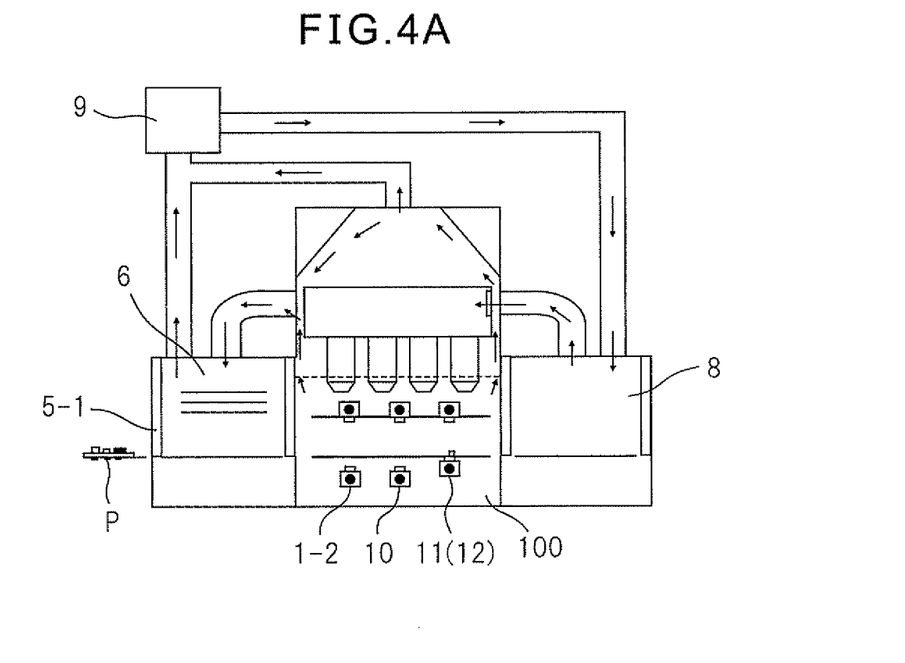
FIG. 4A to FIG. 4C are explanatory view of loading of a printed circuit board in one embodiment of the present invention.
Figure 4B:
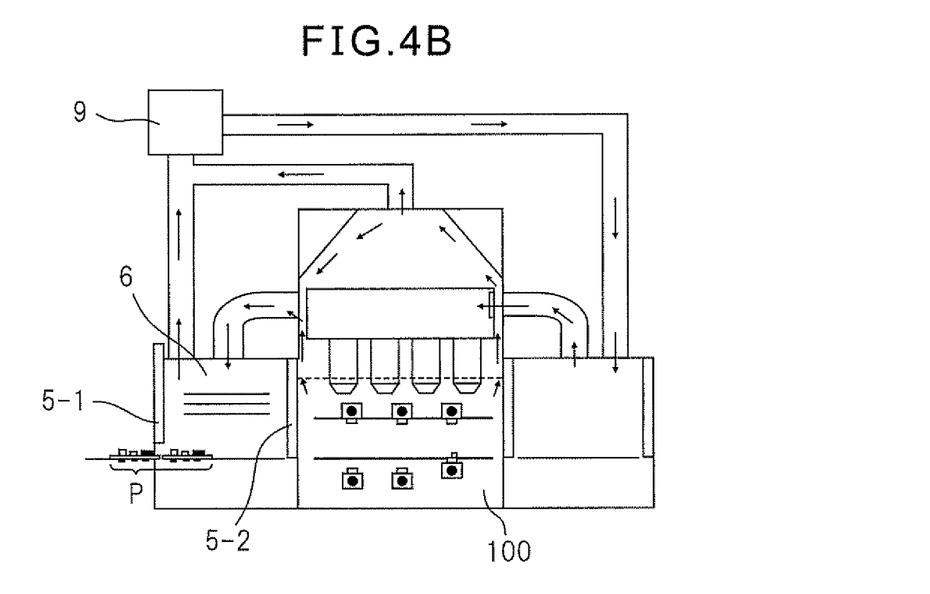
Figure 4C:
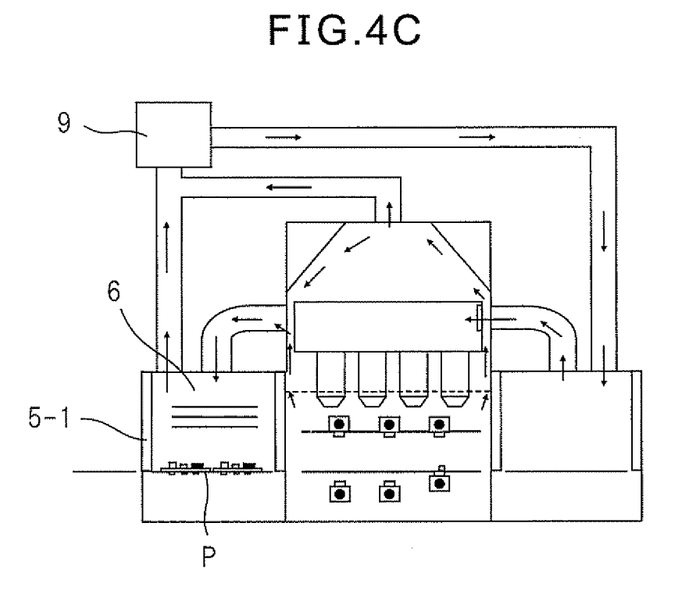
Figure 4D:
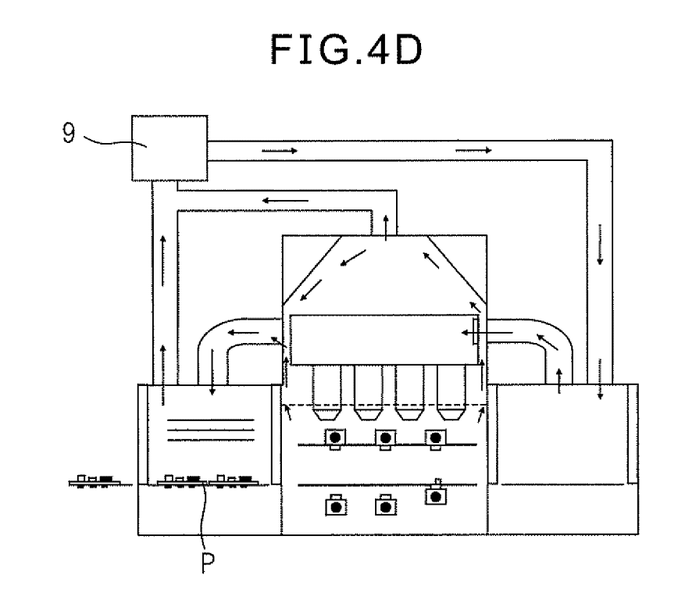
FIG. 4D to FIG. 4F are explanatory views of loading and unloading of a printed circuit board in a preheating chamber in one embodiment of the present invention.
Figure 4E:
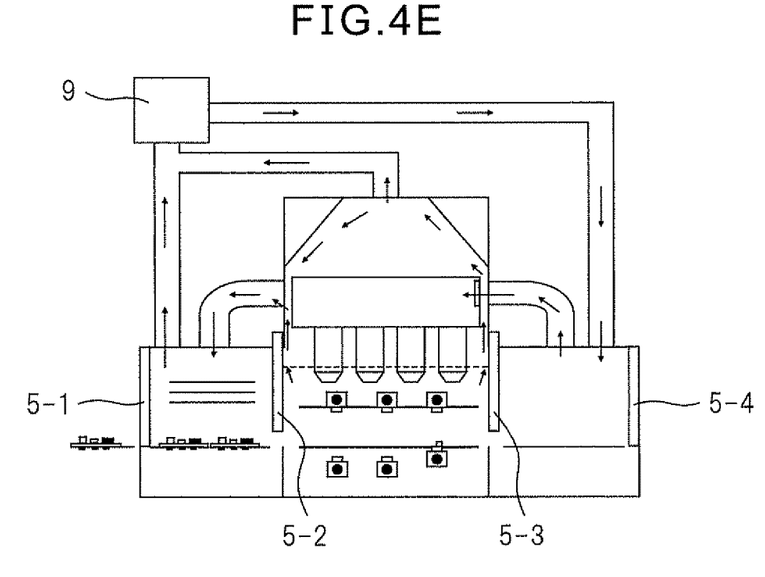
Figure 4F:
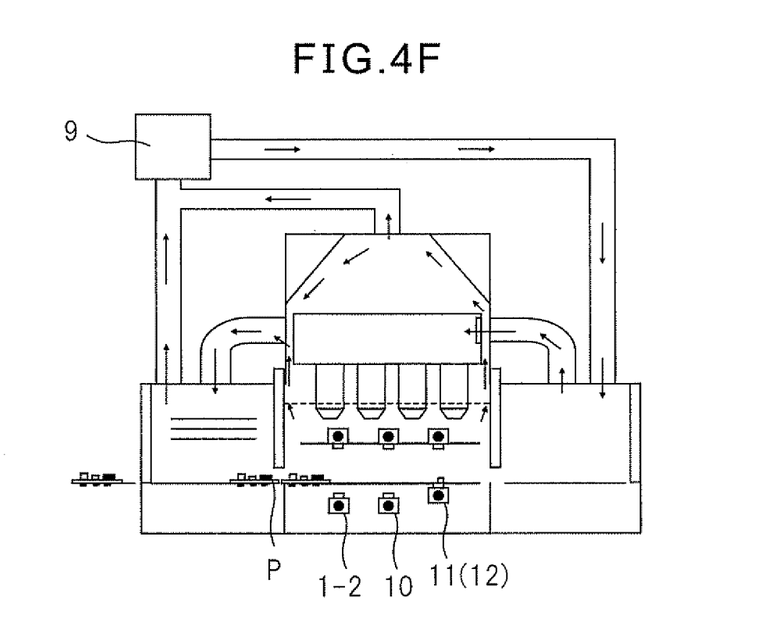
Figure 4G:
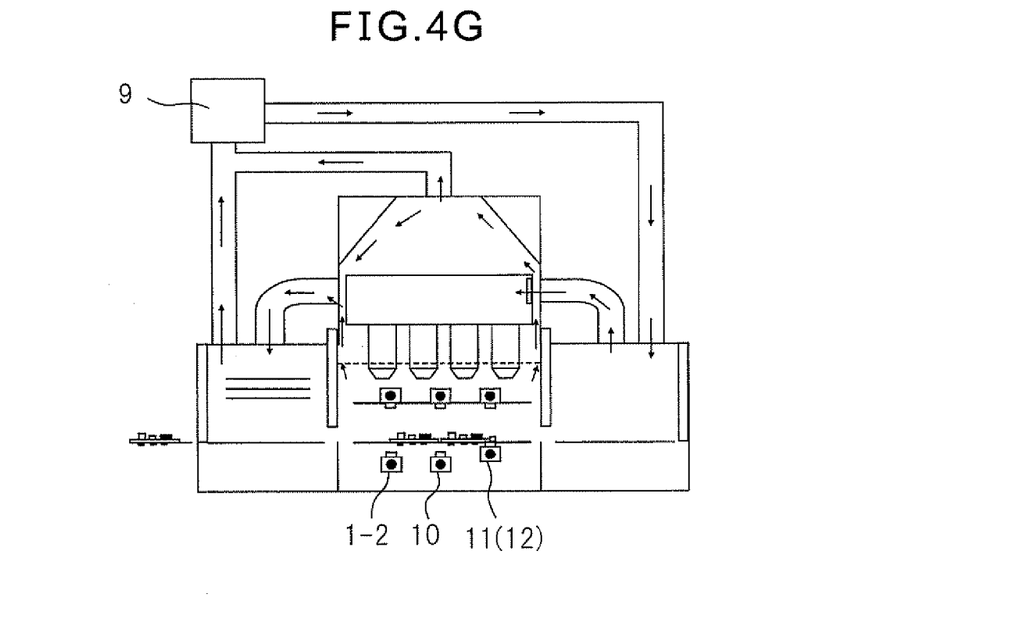
FIG. 4G to FIG. 4I are explanatory views of heating by contact heat transfer and heating by blowing hot gas of a printed circuit board in a heating oven in one embodiment of the present invention.
Figure 4H:
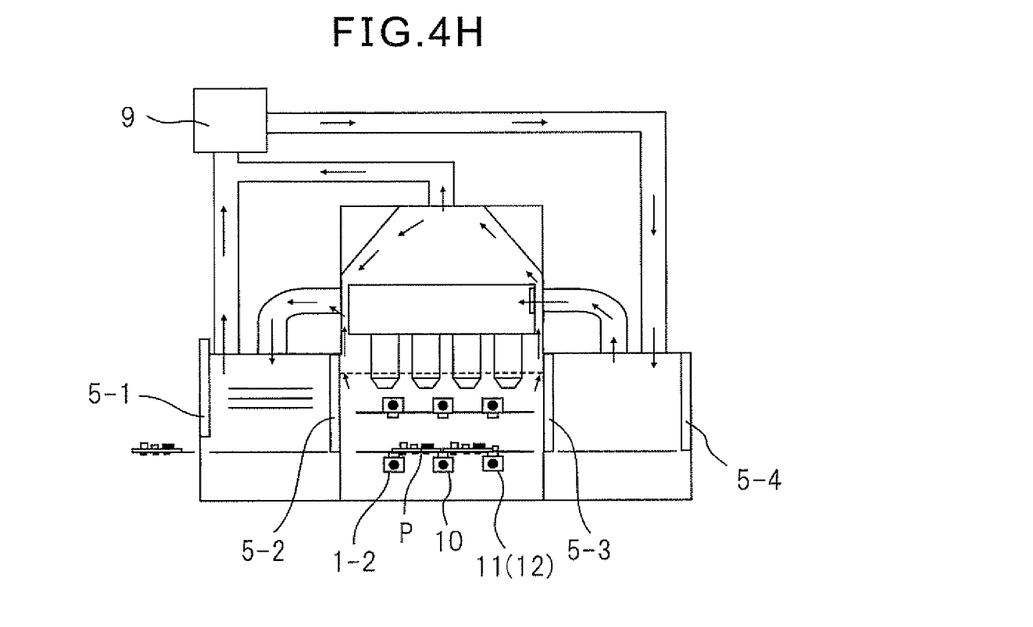
Figure 4I:
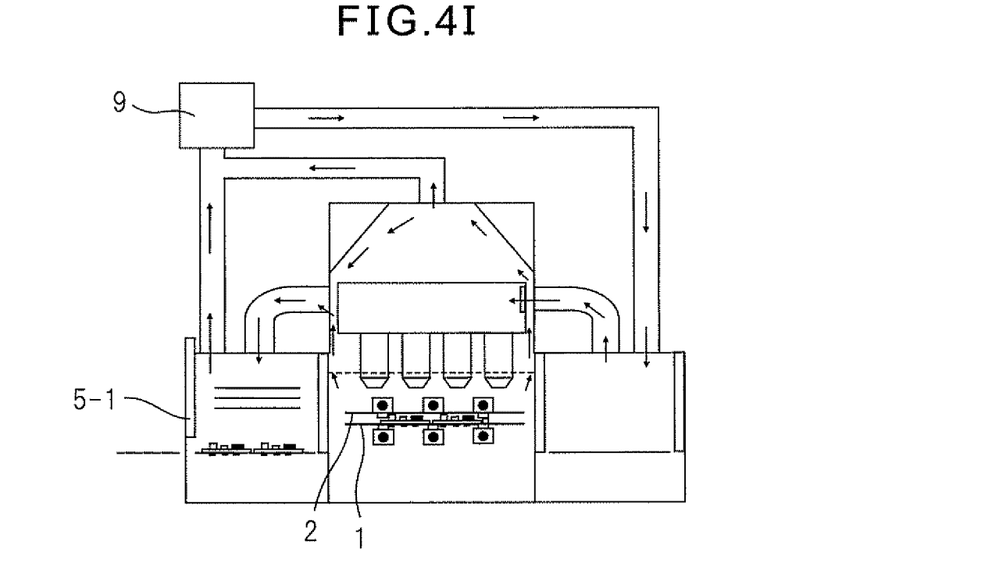
Figure 4J:
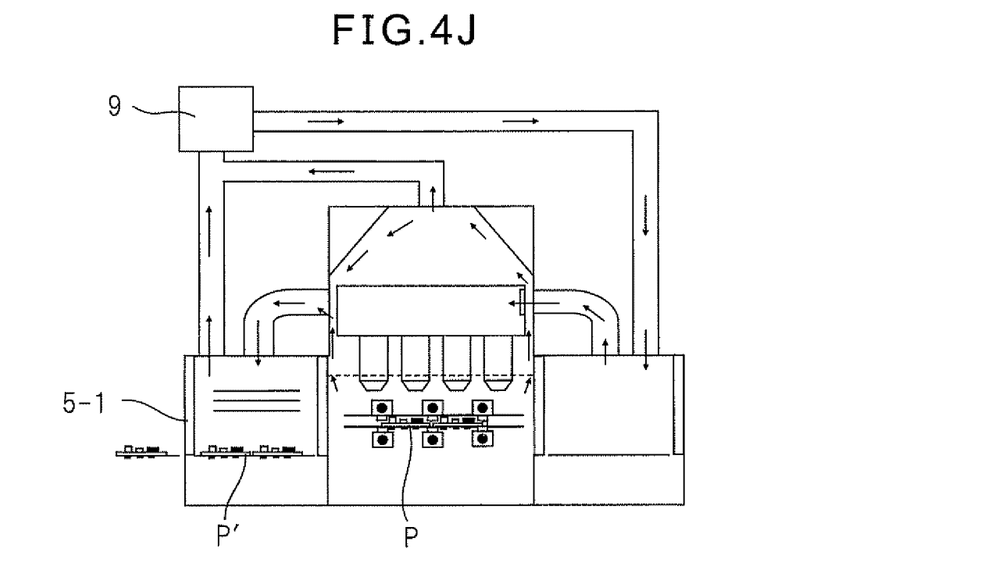
FIG. 4J to FIG. 4L are explanatory views of unloading of a printed circuit board in a heating oven in one embodiment of the present invention.
Figure 4K:
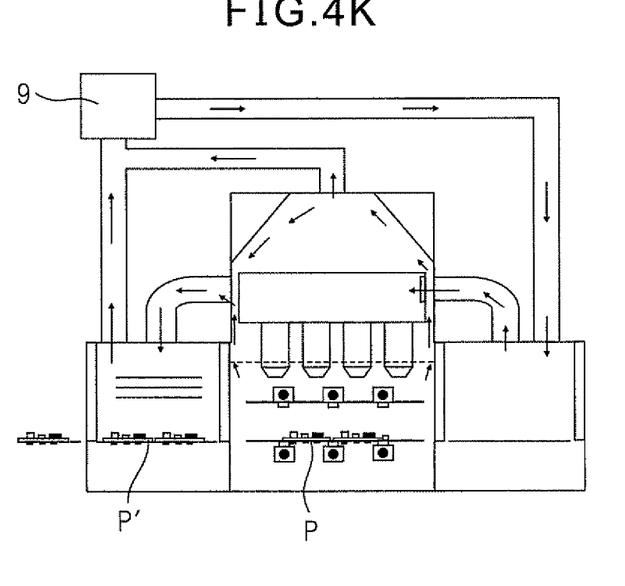
Figure 4L:
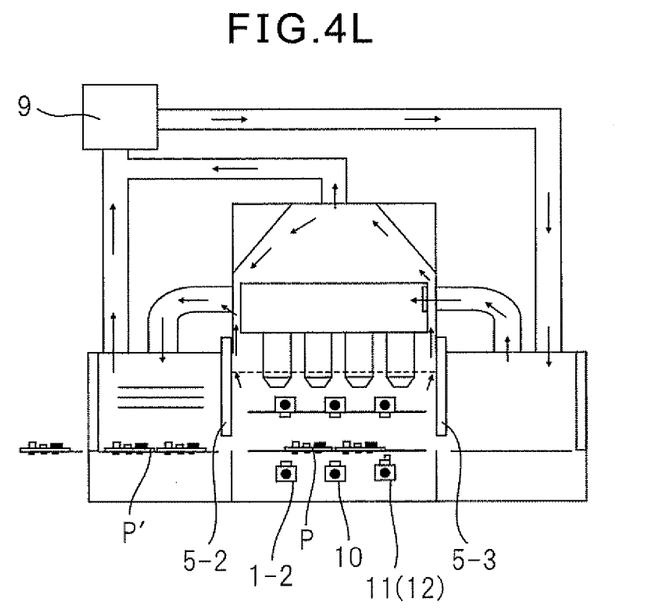
Figure 4M:
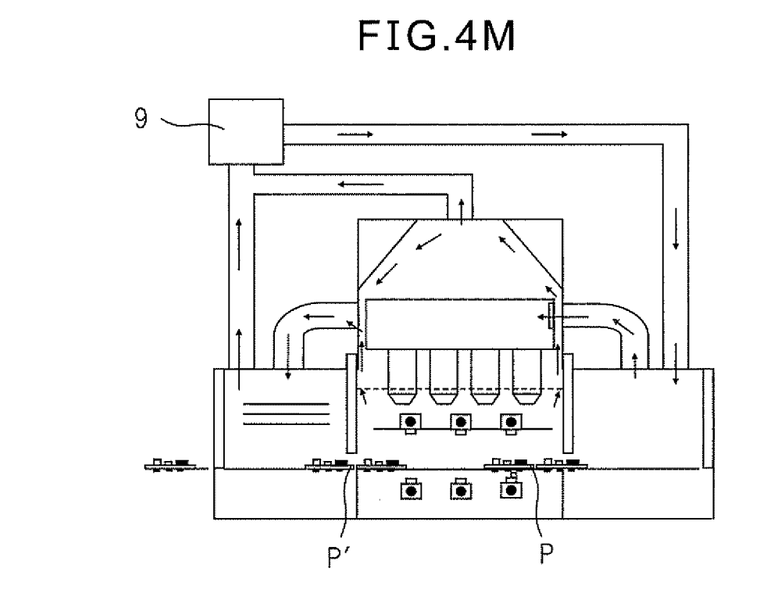
FIG. 4M to FIG. 4O are explanatory views of unloading of a printed circuit board from a heating oven and loading into a cooling chamber in one embodiment of the present invention.
Figure 4N:
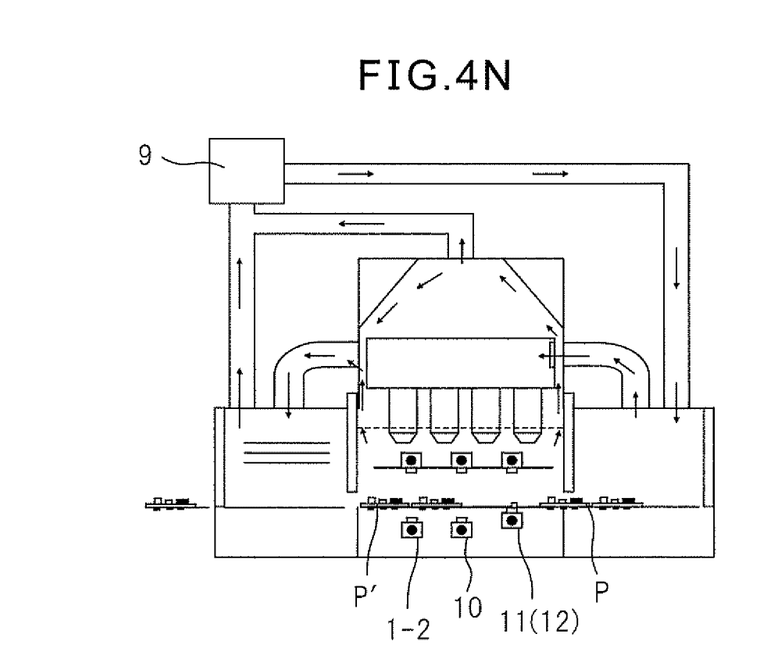
Figure 4O:
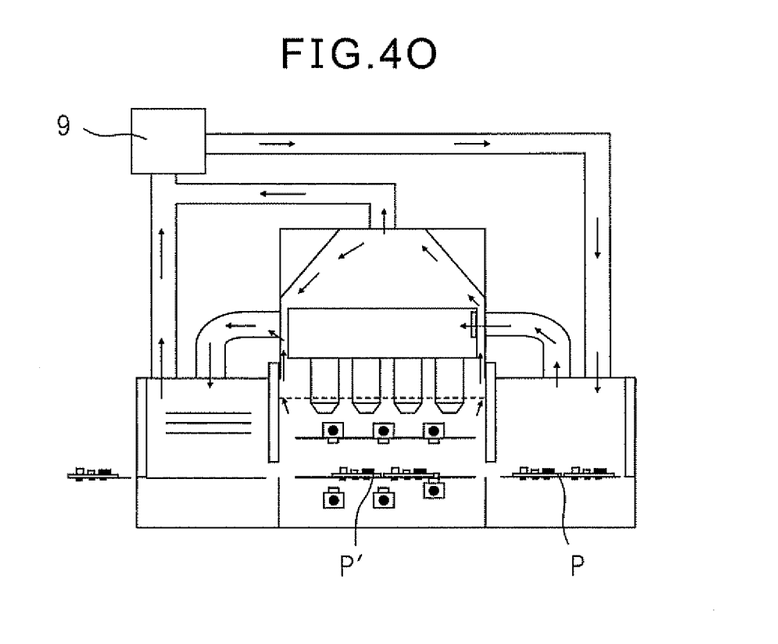
Figure 4P:
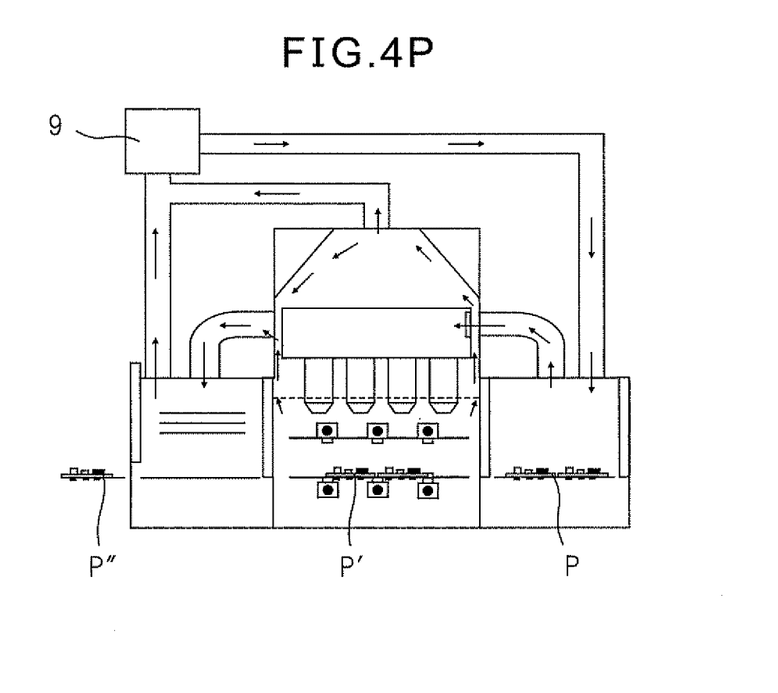
FIG. 4P and FIG. 4Q are explanatory views of loading and unloading of a printed circuit board which are repeatedly performed in a reflow oven in one embodiment of the present invention.
Figure 4Q:
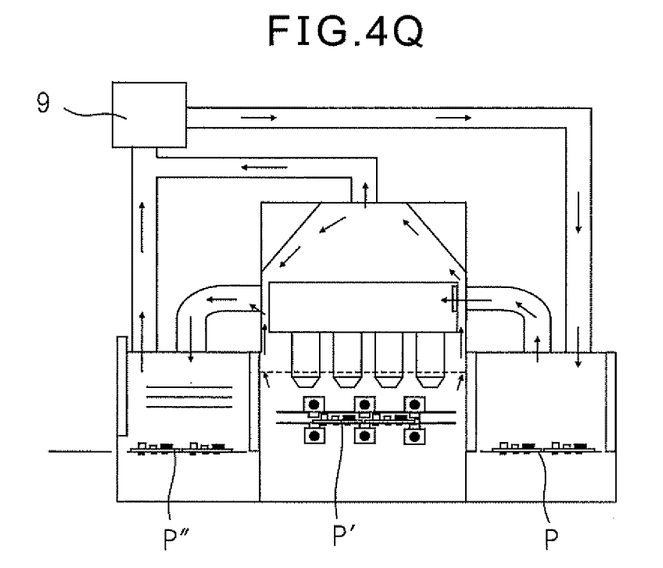

FIG. 3A is an explanatory view of a transport rail of one embodiment of the present invention in the case of two obtained boards, FIG. 3B is an explanatory view of a transport rail of one embodiment of the present invention in the case of changing the vertical direction (width direction, Y-axis direction) in the case of two obtained boards, FIG. 3C is a cross-sectional view of an intermediate vertical frame, and FIG. 3D is an explanatory view of a transport rail of one embodiment of the present invention in the case of four obtained boards. FIG. 4A to FIG. 4Q are explanatory view of loading, heating, and unloading of a printed circuit board at a reflow oven in one embodiment of the present invention.

The procedure for two obtained boards of FIGS. 3A and 3B will first be explained. Here, the horizontal direction on the paper surface of FIGS. 3A and 3B, that is, the loading direction (advancing direction) of the printed circuit board, is defined as the "X-axis direction", while the vertical direction on the paper surface of FIGS. 3A and 3B (or width direction) is defined as the "Y-axis direction". Below, the vertical and horizontal directions (or X-Y-axis directions) are defined as above for the explanation.

The transport rail 1 is comprised of vertical and horizontal fixed frames constituted by a horizontal direction fixed horizontal external frame rail 1-1 and a vertical direction fixed vertical outer frame 1-2 and vertical and horizontal moving frames constituted by a first moving horizontal rail 1-3, second moving horizontal rail 1-4, and intermediate vertical frames 10, 11 (usually several except in case of single obtained board). These all have heat transfer heaters 20 embedded inside them (in the intermediate vertical frame 10, 20-1 to 20-3). As shown in FIG. 2, the transport rail 1 as a whole is arranged inside of the heating oven 100. The horizontal direction fixed horizontal external frame rail 1-1, vertical direction fixed vertical outer frame 1-2, first moving horizontal rail 1-3, and second moving horizontal rail 1-4 overall form an external frame member 30 (not shown). The top surfaces of these are set on the same plane. The transport rail 1 is comprised of an external frame member 30 and intermediate vertical frames 10, 11.

On the other hand, there are two intermediate vertical frames 10, 11, 10', 11' in the case of FIG. 3A and 3B. As seen in FIG. 4A, there is furthermore a positioning vertical frame 12 which functions as a positioning stopper. The positioning vertical frame 12 also functions as an intermediate vertical frame. The intermediate vertical frames are not limited to two. The number can be suitably changed in accordance with the number of obtained boards. The intermediate vertical frames 10, 11 and the intermediate vertical frames 10', 11', from the relationship of numbers of the obtained boards, are set aligned in a single row on the line Q as seen in FIGS. 3A, 3B, and 3D, but if positioning them independently, modified shapes can also be handled. The external frame member 30 and the intermediate vertical frames are formed on the same plane so that the printed circuit board P which is transported slides on the rail. As seen in FIG. 4A, part of the positioning vertical frame 12 (serving also as intermediate vertical frame 11) projects out from the flat surface of the external frame member 30 to function as a stopper and stop the transported printed circuit board P. When a printed circuit board P is unloaded to the cooling chamber 8, the positioning vertical frame 12 descends to the bottom.

The electric heater 20 which is embedded at the inside is divided into sections in the horizontal direction to enable partial heating so that no energy loss occurs at the electric heater since the horizontal direction rails 1-1, 1-3, and 1-4 are long rails. Suitable switching is possible to enable partial heating in accordance with the size and number of boards obtained of the printed circuit boards (two boards P-1, P-2, four boards P-1 to P-4, or other numbers of obtained boards). The vertical direction fixed vertical outer frame 1-2 can also similarly be partially heated. In this way, the transport rail 1 is a transport rail on the top surface of which the printed circuit board slides and forms a contact fixture for heating the printed circuit board by contact heat transfer.

The first moving horizontal rail 1-3 and the second moving horizontal rail 1-4 move in parallel with respect to the horizontal direction fixed horizontal external frame rail 1-1 by a slide guide or other guide mechanism. As shown in FIG. 3B, the distances between the fixed horizontal external frame rail 1-1 and the first moving horizontal rail 1-3 and second moving horizontal rail 1-4 are respectively L1, L2. In FIG. 3B, matching with the size of the printed circuit board, L1 is larger. Of course, it is also possible to further add a third moving horizontal rail etc. in accordance with the number of obtained boards of the printed circuit board. The printed circuit board P is loaded into the preheating chamber 6 by a pusher in the present embodiment. The loading may also be performed by another known means.

Further, the printed circuit board P may be loaded from the preheating chamber 6 into the heating oven 100, unloaded from the heating oven 100 to the cooling chamber 8, and unloaded to the outside by making an L-shaped pullout tool 31 abut against and pull out the back end edge of the printed circuit board P in the advancing direction. The L-shaped pullout tool is made to be driven by a cylinder in the Y-axis direction from the outside from a Y-axis direction slit of the heating oven or cooling chamber. When not using the L-shaped pullout tool, since it would interfere with loading, the tool is made to rotate by 90 degrees from the X-axis direction to the Z-axis direction at the side part inside of the heating oven. Note that the invention is not limited to an L-shaped pullout tool 31. A hook type pullout tool or belt power or other known means may also be used.

Next, referring to FIG. 3B, FIG. 3C, and FIG. 4A, the intermediate vertical frames 10, 11 and positioning vertical frame 12 will be explained. As seen in FIG. 3B, the intermediate vertical frames 10, 11, 10', 11' have cross-sectional T-shapes. The member 10-3 is configured to nestle inside the members 10-1, 10-2. Variable adjustment is possible corresponding to changes in the distances L1, L2. Reference numerals 20-1 to 20-3 indicate embedded heaters. The line Q is the boundary line of the printed circuit boards P-1, P-2. The top surfaces of the members 10-1, 10-2, and 10-3 are rail surfaces used as sliding surfaces over which the printed circuit boards are transported. The intermediate vertical frames 11, 10', 11' also are similarly configured. Depending on the number of obtained boards, intermediate vertical frames may be added. The positioning vertical frame 12 is configured substantially the same as the one side of the intermediate vertical frame bisected at the center, but is further provided with a projecting part as a stopper at the top surface. In the same way as the intermediate vertical frame, a heater is embedded.

In the reflow soldering system of the present embodiment, the transport rail 1 has a heater embedded in it and, together with the top heat transfer heater 2, clamps and heats the outer edge part of the printed circuit board P. While heat is transferred from the outer edge side, at the center part of the printed circuit board P, the hot gas blowing heating unit 3 supplies the printed circuit board P with hot air. In this case, the air flow and temperature which calculated in advance from the temperature profile are respectively controlled for the supply, so the printed circuit board is uniformly heated. The amount of heat supplied from the hot gas blowing heating unit 3 is calculated based on the amount of insufficient heat which is obtained from the results of analysis of the heat transfer. In this way, it is possible to focus on the high heat transfer rate of heating by contact heat transfer and the uniform heating of heating by blowing hot gas and make joint use of the two so as to realize small-sized, high speed uniform heating. Compared with the oven length of the comparative art, the length can be shortened to less than one-third. Further, heating by contact heat transfer, which clamps and heats the outer edge part of the printed circuit board P, clamps the board from the top and bottom directions (i.e., warping direction of board), so it is possible to suppress warping. Due to this, soldering is never performed in a state where the board is warped due to the difference in heat expansion of the resin and copper interconnects of the board.

Referring to FIG. 4A to FIG. 4Q, the loading and unloading of printed circuit boards which are repeated, will be explained. FIG. 4A to FIG. 4C are views which explain the loading of a printed circuit board, while FIG. 4D to FIG. 4F are explanatory views of the loading and unloading of a printed circuit board in a preheating chamber. FIG. 4G to FIG. 4I are explanatory views of heating by contact heat transfer and heating by blowing hot gas of a printed circuit board in a heating oven in one embodiment of the present invention, while FIG. 4J to FIG. 4L are explanatory views of unloading in a heating oven. FIG. 4M to FIG. 4O are explanatory views of unloading from a heating oven and loading into a cooling chamber. FIG. 4P and FIG. 4Q are explanatory views of loading and unloading of a printed circuit board which are repeatedly performed in a reflow oven in one embodiment of the present invention.

Below, embodiments of the present invention will be explained along with the drawings. In FIG. 4A to FIG. 4C, the an door 5-1 is opened, a printed circuit board P is loaded into the preheating chamber 6, then is loaded into the preheating chamber 6, then the door is closed. As shown in FIG. 4B, the door 5-2 of the heating oven 100 is closed and enables the nitrogen gas atmosphere of the inside atmosphere to be preserved. If not in an inert gas, the solder will end up oxidizing and cause poor soldering quality, so the atmosphere of the heating oven 100 is preserved as much as possible to maintain a nitrogen gas atmosphere.

In FIG. 4D, the printed circuit board P is preheated in the preheating chamber 6 based on a thermal profile distinct to this reflow soldering system. In FIG. 4F and FIG. 4G, the door 5-2 is opened, then a pusher or pullout tool is used to load the printed circuit board P into the heating oven 100. The door 5-3 also opens, but this is due to the fact, as shown in FIG. 4M to FIG. 4O, that printed circuit boards are repeatedly loaded and unloaded in the reflow oven. In FIG. 4F, the fixed vertical outer frame 1-2 and the intermediate vertical frame 10 descend down, but the positioning stopper 12 (intermediate vertical frame 11) is positioned at the top, so the printed circuit board abuts against the positioning stopper 12 and stops as shown in FIG. 4G.

In FIG. 4H, the doors 5-2 and 5-3 close and heating by contact heat transfer and heating by blowing hot gas of the printed circuit board P in the heating oven 100 are started. In FIG. 4I, the transport rail 1 rises and clamps and heats the outer edge part of the printed circuit board P with the top heat transfer heater 2. At the same time as this, the inside of the printed circuit board P surrounded by the outer edge part is heated by the hot gas blowing heating unit 3 which controlling the air flow and hot air temperature. While heat is transferred from the outer edge side, at the center part of the printed circuit board P, the hot gas blowing heating unit 3 supplies hot air to the printed circuit board P. After heating is finished, as shown in FIG. 4K, the transport rail 1 returns to the usual transport line position. As shown in FIG. 4L, the positioning stopper 12 stands by at the lower position for transport. The door 5-3 opens, then, as shown in FIG. 4M, the printed circuit board is unloaded into the cooling chamber 8. FIG. 4P and FIG. 4Q show the repeated loading of printed circuit boards P''' in the reflow oven of one embodiment of the present invention.

While the invention has been described by reference to specific embodiments chosen for purposes of illustration, it should be apparent that numerous modifications could be made thereto by those skilled in the art without departing from the basic concept and scope of the invention.

What is claimed is:

1. A reflow soldering system which transports a printed circuit board on which a solder paste has been printed or coated to a sealable heating oven for reflow soldering, wherein said heating oven is provided with a contact heating unit which has a transport rail which supports an outer edge part of said printed circuit board from below and a top heat transfer heater which supports an outer edge part of said printed circuit board from above, and with a hot gas blowing heating unit for heating inside of the printed circuit board, said transport rail contains heat transfer heaters embedded therein which heat the outer edge part of the printed circuit board, said transport rail or top heat transfer heater moves in an up-down direction after loading of said printed circuit board so that said transport rail and top heat transfer heater clamp and heat the outer edge part of said printed circuit board, and said transport rail comprises comprises:

an external frame member that is formed by a vertical direction fixed vertical outer frame, a horizontal direction fixed horizontal external frame rail, and a first moving horizontal rail and a second moving horizontal rail together forming horizontal moving frames; and intermediate vertical frames forming at least one intermediate vertical moving frame, and comprising a positioning stopper, said horizontal moving frames and said at least one intermediate vertical moving frame being configured to move depending on a size of the outer edge part and number of obtained boards of said printed circuit board, such that the transport rail is configured to handle different sizes of the outer edge part of the printed circuit board.

2. The reflow soldering system as set forth in claim 1, wherein the inside of said printed circuit board surrounded by the outer edge part is heated by said hot gas blowing heating unit while controlling air flow and hot air temperature.

3. The reflow soldering system as set forth in claim 1, wherein said at least one intermediate vertical frames and said positioning stopper are comprised in said transport rail to be able to move up and down independently of each other.

4. The reflow soldering system as set forth in claim 1, wherein said reflow soldering system is provided with a preheating chamber and a cooling chamber.

5. The reflow soldering system set forth in claim 4, wherein the reflow soldering system has a hot air circulation system which makes hot air supplied from said hot gas blowing heating unit to circulate to said preheating chamber, then has a fume recovery box to cool flux fumes which are produced at said heating oven to condense for recovery, and then furthermore makes the hot air circulate to said cooling chamber where the circulated air is made to merge with the hot air supplied from said hot gas blowing heating unit.

* * * * *